United States Patent [19]

Naito

[11] 4,386,235
[45] May 31, 1983

[54] FM STEREO DEMODULATOR CIRCUIT

[75] Inventor: Michinori Naito, Tokyo, Japan

[73] Assignee: Trio Kabushiki Kaisha, Tokyo, Japan

[21] Appl. No.: 234,962

[22] Filed: Feb. 17, 1981

[30] Foreign Application Priority Data

Feb. 21, 1980 [JP] Japan .............................. 55-21638[U]

[51] Int. Cl.³ .............................................. H04H 5/00
[52] U.S. Cl. .................................................. 179/1 GE
[58] Field of Search ............. 179/1 GD, 1 GE, 1 GJ;
329/50, 167

[56] References Cited

U.S. PATENT DOCUMENTS

| 3,721,766 | 3/1973 | Hilbert ............................. 179/1 GE |
| 4,167,650 | 9/1979 | Kusano ............................ 179/1 GE |
| 4,194,161 | 3/1980 | Hershberger ..................... 179/1 GE |
| 4,334,125 | 6/1982 | Inoue ............................... 179/1 GE |

Primary Examiner—A. D. Pellinen
Attorney, Agent, or Firm—Gerald J. Ferguson, Jr.; Joseph J. Baker

[57] ABSTRACT

An FM stereo demodulator comprising a switching signal generator for providing four asymmetrical square wave switching signals whose phase differences from the subcarrier of the FM stereo composite signal are respectively 0°, 90°, 180°, and 270° and whose frequencies are the same as the frequency of the subcarrier; four switching circuits for respectively switching the FM stereo composite signal using the four switching signals; and an undesired-beat cancellation circuit for producing left and right audio signals from the respective output signals of the four switching circuits by cancelling the undesired beat signals in the audio frequency zone, produced by the second harmonic component of the subcarrier and SCA signals contained in the FM stereo composite signals.

2 Claims, 1 Drawing Figure

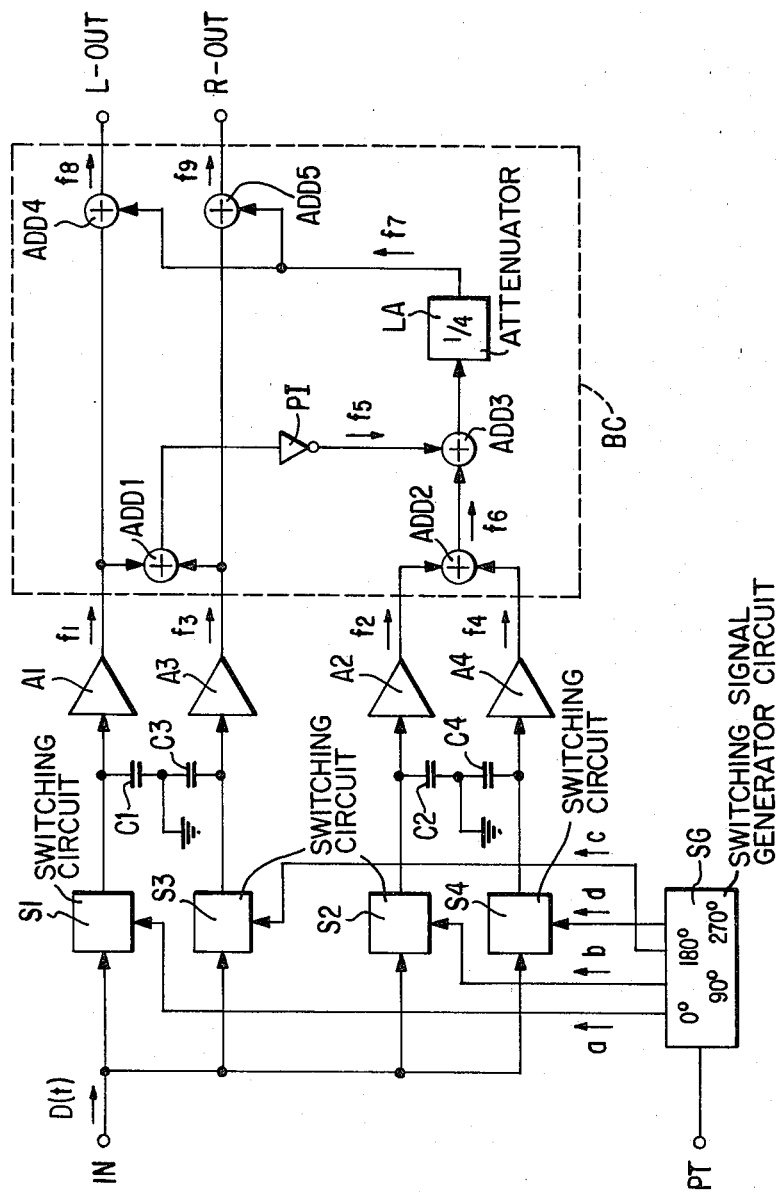

FM STEREO DEMODULATOR CIRCUIT

BACKGROUND OF THE INVENTION

This invention relates to stereo demodulator circuitry for use in a pilot tone, FM stereo broadcasting system.

In conventional stereo demodulator circuits, it is known that the second harmonic component of the subcarrier contained in the output signal and the SCA (Subsidiary Communication Authorization) signal, which is ordinarily used, mutually interfere, causing so-called SCA beat interference. In other words, the frequency of the subcarrier is normally 38 KHz. Thus, the 76 KHz second harmonic and the SCA signal frequency band, 60–74 KHz (subcarrier is 67 KHz), tend to develop undesired beat signals in the audio frequency zone and mix with the desired reproduced sound causing strong interference.

In order to eliminate this SCA beat interference, an SCA signal elimination filter is conventionally employed in the stage previous to the stereo demodulator circuit to remove the SCA signal from the stereo composite signal. However, the stereo composite signal is subjected to a phase deviation because of this filter. Consequently, a decrease in the separation between the left and right signals and a deterioration of frequency characteristics are unavoidable. It thus is necessary to insert a shift circuit on the output side of the filter or install a cross-talk blanking circuit after the stereo demodulator circuit to compensate for the decreased separation, and to correct the frequency characteristic with a tone control circuit, etc. However, in all cases, the adjustment is complicated and a superior effect cannot be expected.

SUMMARY OF THE INVENTION

The object of this invention is to provide an improved FM stereo signal demodulator circuit without the shortcomings described above.

Other objects and advantages of this invention will be apparent from a reading of the following specification and claims taken with the drawing.

BRIEF DESCRIPTION OF THE DRAWING

The sole FIGURE of the drawing is a circuit block diagram of an illustrative, preferred embodiment of an FM stereo demodulator circuit in accordance with the invention.

DETAILED DESCRIPTION OF PREFERRED EMBODIMENT OF THE INVENTION

IN is an input terminal that inputs the FM stereo composite signal, D(t), which is outputted from a detection circuit in the previous stage not shown in the drawing. PT is an input terminal for the pilot signal (19 KHz). SG is a switching signal generator circuit that outputs asymmetric square wave switching signals, a, b, c, and d, whose respective phase differences between the subcarrier (38 KHz) of the composite signal, D(t), are 0°, 90°, 180°, and 270°. S1, S2, S3, and S4 are switching circuits that separately switch the respective composite signals with the said switching signals, a, b, c, and d. C1–C4 are capacitors. A1–A4 are buffer amplifier circuits. BC is an undesired-beat cancellation network. ADD1–ADD5 are adder circuits. PI is a phase inverter circuit. LA is an attenuation circuit that quarters the level of the input signal applied thereto. L-OUT is the output terminal for the left signal. R-OUT is the output terminal for the right signal.

Assuming the composite signal, D(t) is $$D(t) = \cos pt + \cos(\omega c + q)t + \cos(\omega c - q)t + k\cos\omega s t \quad (1)$$

where:
- $\cos pt$: main signal
- $\cos qt$: subsignal
- $k\cos\omega s t$: SCA signal
- $\omega c$: subcarrier angular frequency
- $\omega s$: SCA instantaneous angular frequency.

Next, if the four switching signals, a, b, c, and d that are outputted from the switching signal generator circuit, SG, are expressed by numerical equations, the phase differences between the subcarriers are 0° for signal a, 90° for signal b, 180° for signal c, and 270° for signal d. Therefore, they can be Fourier-expanded as:

$$a = s_0 + s_1 \cos\omega_c t + s_2 \cos 2\omega_c t + \ldots \quad (2)$$

$$b = s_0 + s_1 \sin\omega_c t - s_2 \cos 2\omega_c t + \ldots \quad (3)$$

$$c = s_0 - s_1 \cos\omega_c t + s_2 \cos 2\omega_c t - \ldots \quad (4)$$

$$d = s_0 - s_1 \sin\omega_c t - s_2 \cos 2\omega_c t - \ldots \quad (5)$$

Here, the beat caused by the difference between $2\omega_c$ and $\omega_s$ is the SCA beat interference problem. Thus, the fourth and higher terms are ignored in all a–d signals in the subsequent calculations.

When the composite signal, D(t), is switched respectively, by the switching signals, a–d shown in equations (2)–(5), the respective signals, $f_1$–$f_4$ are outputted at the buffer amplifier circuits, A1–A4.

$f_1 = a \times D(T)$. When the right side of this equation is developed eliminating the non-audio frequency terms, the result is $f_1'$, $$f_1 = s_0 \cos pt + \frac{s_1}{2}\cos qt + \frac{s_1}{2}\cos qt + \frac{ks_2}{2}\cos(\omega_s - 2\omega_c)t \quad (6)$$

$f_2 = b \times D(t)$. When the right side of this equation is developed eliminating the non-audio frequency terms, the result is $f_2'$, $$f_2 = s_0 \cos pt - \frac{s_1}{2}\sin qt + \frac{s_1}{2}\sin qt - \frac{ks_2}{2}\cos(\omega_s - 2\omega_c)t \quad (7)$$

$f_3 = c \times D(t)$. When the right side of this equation is developed eliminating the non-audio frequency terms, the result is $f_3'$, $$f_3 = s_0 \cos pt - \frac{s_1}{2}\cos qt - \frac{s_1}{2}\cos qt + \frac{ks_2}{2}\cos(\omega_s - 2\omega_c)t \quad (8)$$

$f_4 d \times D(t)$. When the right side of this equation is developed eliminating the non-audio frequency terms, the result is $f_4'$, $$f_4 = s_0 \cos pt + \frac{s_1}{2}\sin qt - \frac{s_1}{2}\sin qt - \frac{ks_2}{2}\cos(\omega_s - 2\omega_c)t \quad (9)$$

Next, adder circuits ADD1–ADD5 in the undesired-beat cancellation network BC, phase inverter circuit PI, and attenuation circuit LA, process signals, $f_1'$–$f_4'$. First, signals $f_1'$ and $f_3'$ are added by adder circuit ADD1 and applied to phase inverter circuit PI to provide $f_5$ as shown in the drawing where $$f_5 = -(f_1 + f_3) \quad (10)$$
$$= -2s_0\cos pt - ks_2\cos(\omega_s - 2\omega_c)t$$

And, when signal $f_2'$ and signal $f_4'$ are added by adder circuit ADD2, $$f_6 = f_2 + f_4 \quad (11)$$
$$= 2s_0\cos pt - ks_2(\omega_s - 2\omega_c)t$$

is obtained. Next, when signals $f_5$ and $f_6$ are added by adder circuit ADD3 and the level is lowered to $\frac{1}{4}$ by attenuation circuit LA, $$f_7 = (f_5 + f_6)/4 \quad (12)$$
$$= -\frac{ks_2}{2}\cos(\omega_s - 2\omega_c)t$$

is obtained. Signal $f_7$ is comprised only of the beat produced by the interference of the second harmonic of the subcarrier angular frequency, $2\omega_c$, and SCA instantaneous angular frequency. When this is added to signals $f_1'$ and $f_3$40 by adder circuits ADD4 and ADD5, signals $f_8$ and $f_9$ are obtained.

$$f_8 = s_0\cos pt + s_1\cos qt \quad (13)$$
$$f_9 = s_0\cos pt - s_1\cos qt \quad (14)$$

An observation of signals, $f_8$ and $f_9$, reveals left and right signals with the beat caused by SCA signals completely cancelled.

Actual measurement of the beat level in this preferred, illustrative circuitry in the vicinity ($\pm 15$ KHz) of the second harmonic (76 KHz) of the subcarrier frequency revealed $-72$ dB over practically the entire zone of this frequency band (61 KHz–91 KHz). This is far below the beat level of $-17$ dB in a conventional circuit where no SCA-signal eliminating filter was used. Accordingly, a very favorable result is obtained.

In summary, when the FM stereo demodulator circuit of this invention is used, the undesired audible beats represented by SCA-beat interference can be effectively suppressed without using any kind of filter. Thus, phase shifting due to such filters can be eliminated, and inconveniences such as decreased separation of left and right stereo signals and deterioration of frequency characteristic, etc. can also be eliminated.

It is to be understood that the above detailed description of an embodiment of the invention is provided by way of example only. Various details of design and construction may be modified without departing from the true spirit and scope of the invention as set forth in the appended claims.

What is claimed is:

1. An FM stereo demodulator for demodulating the left and right audio signals L and R from an FM stereo composite signal comprising
   a switching signal generator for providing four asymmetrical square wave switching signals a, b, c and d whose phase differences from the subcarrier of the FM stereo composite signal are respectively 0°, 90°, 180°, and 270° and whose frequencies are the same as the frequency of the subcarrier;
   four switching circuits for respectively switching the FM stereo composite signal using the four switching signals a, b, c, and d to respectively derive four product signals $f_1$, $f_2$, $f_3$, and $f_4$ where $f_1$ and $f_3$ each contain the L and R signals and an undesired beat signal in the audio frequency band, produced by the second harmonic component of the subcarrier and SCA signals contained in the FM stereo composite signal; and
   means for removing the undesired beat signal from $f_1$ and $f_3$ including
      means for adding $f_2$ and $f_4$;
      means for adding $f_1$ and $f_3$;
      means for deriving the undesired beat signal from $(f_2+f_4)$ and $(f_1+f_3)$; and
      means responsive to the derived undesired beat signal for cancelling the undesired beat signal from $f_1$ and $f_3$.

2. A demodulator as in claim 1 where $f_2+f_4=f_6$ and said means for removing the undesired beat signal from $f_1$ and $f_3$ further includes a phase invertor to obtain $-(f_1+f_3)=f_5$; means for adding $f_5$ and $f_6$; attenuation means for deriving $(f_5+f_6)/4=f_7$, which is the derived undesired beat signal; and means for respectively adding $f_7$ to $f_1$ and $f_3$ to remove the undesired beat signal from each of $f_1$ and $f_3$.

* * * * *